(12) United States Patent
Park et al.

(10) Patent No.: US 10,978,668 B2
(45) Date of Patent: Apr. 13, 2021

(54) ORGANIC LIGHT EMITTING DISPLAY DEVICE AND METHOD OF MANUFACTURING THE SAME

(71) Applicant: SAMSUNG DISPLAY CO., LTD., Yongin-si (KR)

(72) Inventors: Gwui-Hyun Park, Yongin-si (KR); Pil Soon Hong, Yongin-si (KR); Chul Won Park, Yongin-si (KR); Jeong Min Park, Yongin-si (KR); Hyun Jin Son, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 14 days.

(21) Appl. No.: 16/443,202

(22) Filed: Jun. 17, 2019

(65) Prior Publication Data

US 2020/0067014 A1 Feb. 27, 2020

(30) Foreign Application Priority Data

Aug. 22, 2018 (KR) .................. 10-2018-0098130

(51) Int. Cl.
| | |
|---|---|
| *H01L 27/32* | (2006.01) |
| *H01L 51/00* | (2006.01) |
| *H01L 51/52* | (2006.01) |
| *C07F 7/08* | (2006.01) |
| *C09J 11/06* | (2006.01) |

(52) U.S. Cl.
CPC ........ *H01L 51/5246* (2013.01); *C07F 7/0838* (2013.01); *C09J 11/06* (2013.01); *H01L 27/3246* (2013.01); *H01L 27/3258* (2013.01); *H01L 51/0094* (2013.01); *H01L 2227/323* (2013.01)

(58) Field of Classification Search
CPC ............ H01L 27/3246; H01L 27/3258; H01L 51/0094; H01L 51/5246; H01L 2227/323; C09J 11/06; C07F 7/0838
See application file for complete search history.

(56) References Cited

U.S. PATENT DOCUMENTS

| | | | |
|---|---|---|---|
| 9,771,459 B2 | 9/2017 | Mittal et al. | |
| 9,880,424 B2 | 1/2018 | Hyodo et al. | |
| 2009/0162615 A1* | 6/2009 | Miyashita | ............... H01J 11/48 428/167 |
| 2011/0057172 A1* | 3/2011 | Song | ..................... C08G 77/04 257/40 |
| 2016/0226029 A1* | 8/2016 | Lee | ....................... H01L 27/322 |
| 2016/0266490 A1* | 9/2016 | Yoshida | .................... G03F 7/30 |

FOREIGN PATENT DOCUMENTS

| | | |
|---|---|---|
| JP | 2009-131911 A | 6/2009 |
| JP | 2009-199902 A | 9/2009 |
| KR | 10-2010-0024995 A | 3/2010 |
| KR | 10-1777134 B1 | 9/2017 |

* cited by examiner

*Primary Examiner* — Bijan Ahvazi

(74) *Attorney, Agent, or Firm* — Kile Park Reed & Houtteman PLLC

(57) ABSTRACT

An organic light emitting diode (OLED) display includes a first substrate, a second substrate facing the first substrate, a sealing member interposed between the first substrate and the second substrate, the sealing member including a siloxane material, a semiconductor layer on the first substrate, a planarization layer on the semiconductor layer, and a barrier rib on the planarization layer. The planarization layer or the barrier rib may also include the siloxane material.

19 Claims, 14 Drawing Sheets

FIG. 13
Glass / Glass
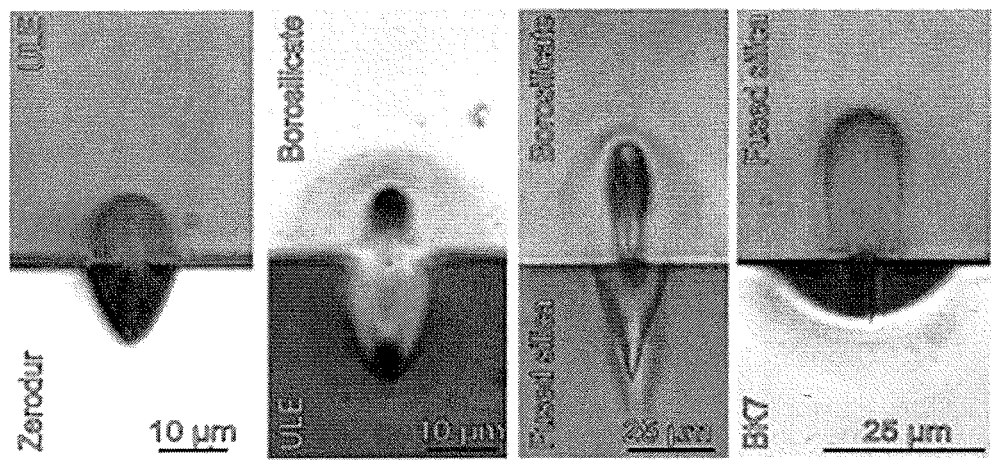
Glass / Silicon
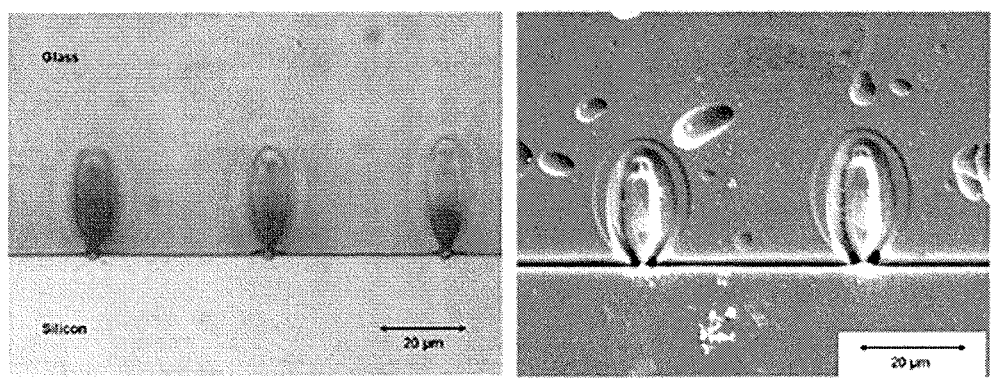

ORGANIC LIGHT EMITTING DISPLAY DEVICE AND METHOD OF MANUFACTURING THE SAME

CROSS-REFERENCE TO RELATED APPLICATION

Korean Patent Application No. 10-2018-0098130, filed on Aug. 22, 2018, in the Korean Intellectual Property Office, and entitled: "Organic Light Emitting Display Device and Method of Manufacturing the Same," is incorporated by reference herein in its entirety.

BACKGROUND

1. Field

Embodiments relate to an organic light emitting diode (OLED) display and a manufacturing method thereof.

2. Description of the Related Art

A display device is a device for displaying an image, and recently, an organic light emitting diode (OLED) has been highlighted.

The OLED display has a structure in which at least one organic layer that includes an emission layer is disposed between a first electrode and a second electrode.

In such an OLED display, when moisture or oxygen flows into the device from the surrounding environment, the lifetime of the device may be shortened due to oxidation and peeling of an electrode material, the luminous efficiency may be deteriorated, and luminescent colors may be altered.

Thus, in manufacturing of the OLED display; a sealing process is generally carried out to prevent permeation of moisture by isolating the device from the outside.

The above information disclosed in this Background section is only for enhancement of understanding of the background of the invention and therefore it may contain information that does not form the prior art that is already known in this country to a person of ordinary skill in the art.

SUMMARY

Embodiments are directed to an organic light emitting diode (OLED) display, including a first substrate, a second substrate facing the first substrate, a sealing member interposed between the first substrate and the second substrate, the sealing member including a siloxane material, a semiconductor layer on the first substrate, a planarization layer on the semiconductor layer, and a barrier rib on the planarization layer. The planarization layer or the barrier rib may also include the siloxane material.

The first substrate may be divided into a display area and a non-display area, and the sealing member may be in the non-display area.

The sealing member may include a first sealing member that is on a same layer as the planarization layer and a second sealing member that is on a same layer as the barrier rib.

The first sealing member may have a thickness such that a top surface thereof is at about a same height as a top surface of the planarization layer.

The second sealing member may have a thickness such that a top surface thereof is higher than a top surface of the barrier rib.

A width of the sealing member may be about 5 μm to about 300 μm, and a thickness of the sealing member may be about 3 μm to about 8 μm.

The siloxane material included in the sealing member may include a compound represented by Chemical Formula 1:

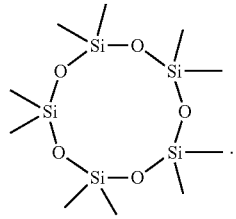

[Chemical Formula 1]

The first substrate and the second substrate may be bonded to each other by a femtosecond laser.

The first substrate and the second substrate may be bonded to each other by the femtosecond laser focused at one end of the sealing member.

Shear strength of the first substrate and the second substrate that are bonded to each other may be about 50 MPa to about 200 MPa.

The OLED display may further include a pixel electrode on the planarization layer, an organic emission layer formed on the pixel electrode, and a common electrode on the organic emission layer.

The first substrate or the second substrate may include glass.

Embodiments are also directed to a method for manufacturing an organic light emitting diode (OLED) display, the method including forming a display element on a first substrate, forming a sealing member that includes a siloxane material on the first substrate, and bonding the first substrate and a second substrate by placing the second substrate to face the first substrate and irradiating a laser to the sealing member.

A femtosecond laser may be used as the laser.

The first substrate may be divided into a display area where the display element is disposed and a non-display area, and the sealing member may be applied to the non-display area to surround the display element.

The forming the display element on the first substrate may include forming a semiconductor layer on the first substrate, forming a gate insulation layer to cover the semiconductor layer, and forming a planarization layer on the gate insulation layer.

The planarization layer may include the siloxane material, and the method may further include simultaneously forming a first sealing member and the planarization layer.

The method may further include forming a barrier rib on the planarization layer, the barrier rib also including the siloxane material, and simultaneously forming a second sealing member on the first sealing member with the forming of the barrier rib.

The forming the display element on the first substrate may include forming a semiconductor layer on the first substrate, forming a gate insulation layer to cover the semiconductor layer, forming a planarization layer on the gate insulation layer, and forming a barrier rib on the planarization layer.

The barrier rib may also include the siloxane material, and the method may include simultaneously forming the sealing member and the barrier rib.

BRIEF DESCRIPTION OF THE DRAWINGS

Features will become apparent to those of skill in the art by describing in detail example embodiments with reference to the attached drawings in which:

FIG. 13 illustrates cross-sectional views of bonding of different types of substrates.

DETAILED DESCRIPTION

Figure 1:
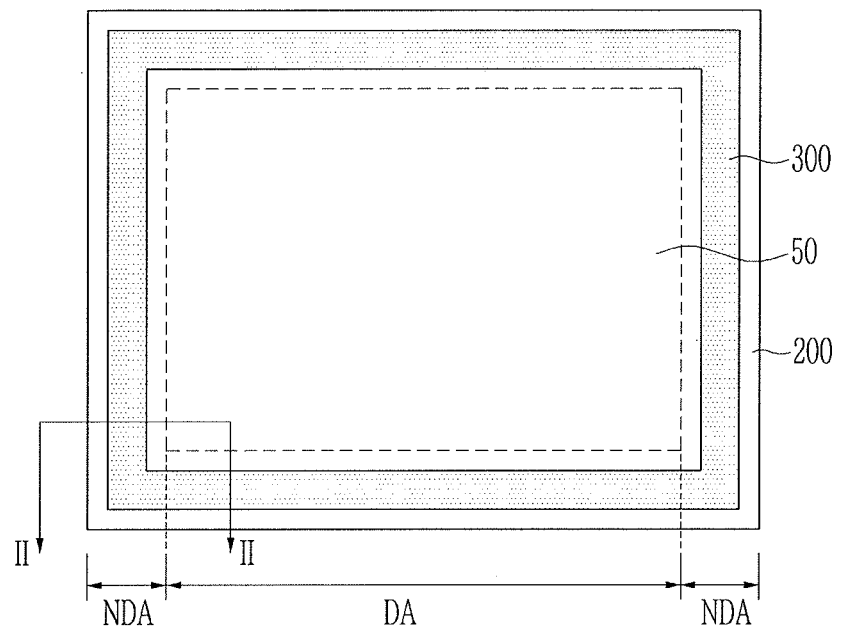
FIG. 1 illustrates a top plan view of an organic light emitting diode display device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" means positioning on or below the object portion, but does not essentially mean positioning on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in this specification, the phrase "on a plane" means viewing a target portion from the top, and the phrase "on a cross-section" means viewing a cross-section formed by vertically cutting a target portion from the side.

Figure 2:
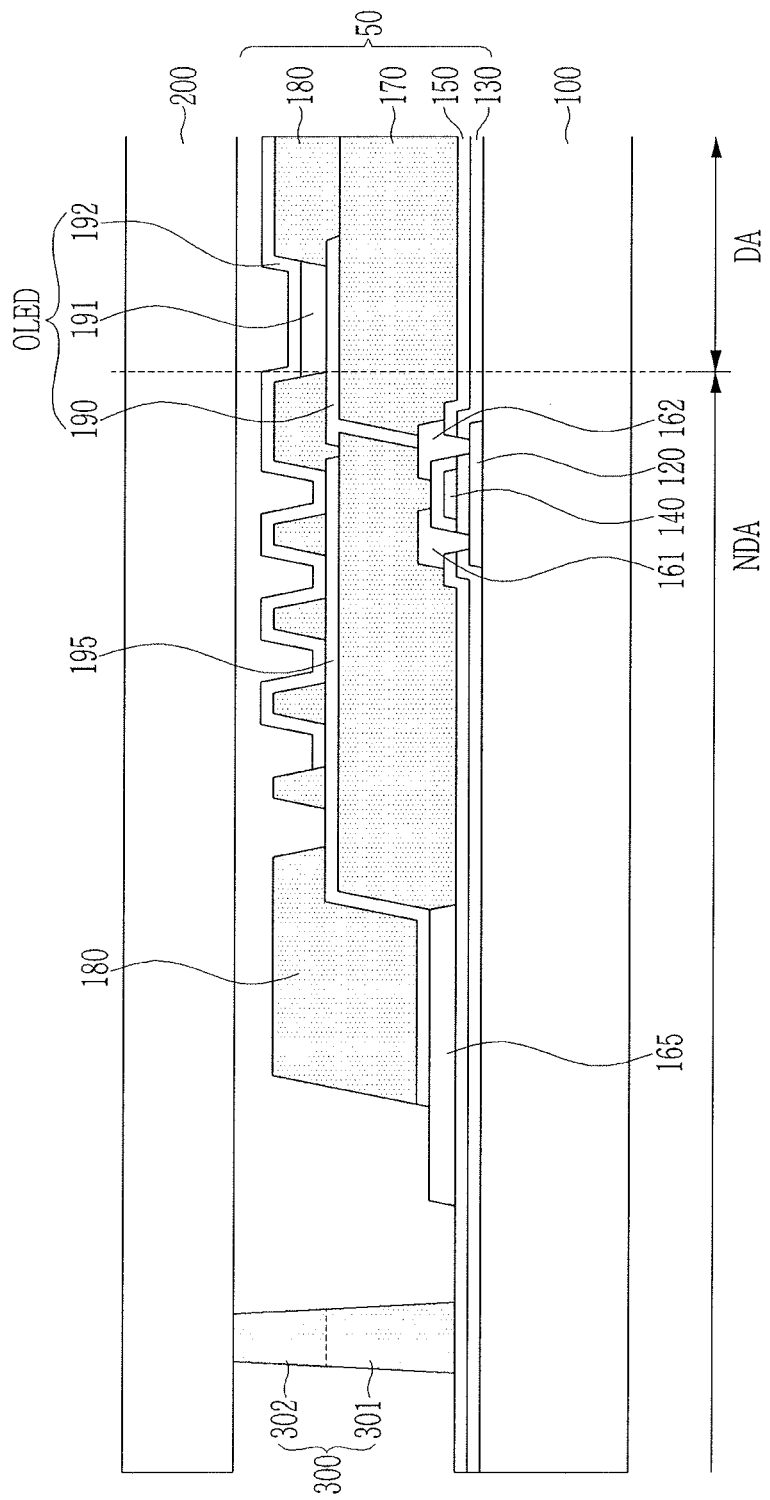
FIG. 2 illustrates a cross-sectional view of FIG. 1, taken along the line II-II.

FIG. 1 is a top plan view of an organic light emitting diode display according to an example embodiment, and FIG. 2 is a cross-sectional view of FIG. 1, taken along the line II-II.

Referring to FIG. 1 and FIG. 2, an organic light emitting diode (OLED) display according to an example embodiment includes a first substrate 100, a second substrate 200, and a sealing member 300.

According to the present example embodiment, the first substrate 100 is disposed in a lower portion of the OLED display, and may be made of, for example, glass, quartz, ceramic, or the like. A display element 50 that includes an organic light emitting diode OLED may be on a top surface of the first substrate 100.

The display element 50 is a portion that displays an image, and may be formed of a plurality of wires, a thin film transistor, a pixel electrode, and an OLED. The display element 50 may be formed of one pixel that displays an image. In another example embodiment, the display element 50 may be formed of a pixel circuit portion that includes a plurality of wires, a thin film transistor, and a pixel electrode, and a light emission portion.

The first substrate 100 may be divided into a display area DA where the display element 50 is disposed and a non-display area NDA where the display element 50 is not disposed. The non-display area NDA refers to a portion excluding the display area DA. The non-display area NDA may include a sealing area where the sealing member 300 is coated and an outer edge portion.

Referring to FIG. 2, the second substrate 200 is on an upper portion of the OLED display, while facing the first substrate 100. The second substrate 200 may be a sealing substrate for sealing the display element 50 that includes an organic light emitting material or the like.

The first substrate 100 and the second substrate 200 are disposed to face each other. The first substrate 100 and the second substrate 200 may be formed in about the same size, and edges of the first substrate 100 and edges of the second substrate 200 may be aligned to be parallel with each other.

The sealing member 300 is disposed between the first substrate 100 and the second substrate 200, and is formed in the non-display area NDA of the first substrate 100.

The sealing member 300 is formed in the non-display area NDA to surround the display element 50. When a plurality of display elements 50 exist in the first substrate 100, the sealing member 300 may be coated on an edge of each of the display elements 50 to seal each of the plurality of display elements 50. The sealing member 300 may be coated to a width of, for example, 10 μm. In addition, depending on locations and shapes of the display elements 50, the sealing member 300 may be coated to be variously shaped such as a quadrangle, a circle, a hexagon, or the like.

The sealing member 300 is provided between the first substrate 100 and the second substrate 200 to bond the first substrate 100 and the second substrate 200 to each other in the OLED display. The sealing member 300 may include a siloxane material, and when a laser is irradiated thereto, the sealing member 300 is cured to bond the substrates together According to a comparative example, a sealing member includes a glass material such as a frit applied to a sealing area of the display, and a laser is irradiated to cure the sealing member. However, when the frit was used, a temperature and a pressure of the sealing member may be different depending on laser irradiation locations. Therefore, bond may result in a difference in the joining area of the sealing member on the upper sealing substrate and the lower substrate, such that a profile may be distorted.

In the OLED display according to an example embodiment, a siloxane material is used, for example, instead of using a frit as a material of the sealing member. A laser that can cure the sealing member within a short period of time may be used such that a bonding area of the sealing member can be uniform, and adherence and reliability can be improved compared to the comparative example.

Hereinafter, an OLED display where the sealing member 300 is formed will be described in detail with reference to the cross-sectional view of FIG. 2.

Referring to FIG. 2, an OLED display according to an example embodiment includes the first substrate 100, the second substrate 200, the display element 50, and the sealing member 300. In the present example embodiment, the display element 50 includes a semiconductor layer 120, a gate insulation layer 130, a gate electrode 140, an interlayer insulation layer 150, a source electrode 161, a drain electrode 162, a planarization layer 170, a pixel electrode 190, a barrier rib 180, an emission layer 191, and a common electrode 192.

The first substrate 100 and the second substrate 200 may be formed as, for example, insulation substrates that are made of glass, quartz, ceramic, or the like.

A buffer layer may be on the first substrate 100, and the buffer layer may be made of, for example, a silicon nitride (SiNx) or a silicon oxide (SiOx). The buffer layer may planarize the top surface and help to prevent permeation of an impurity.

The semiconductor layer 120 is on the first substrate 100, and may include, for example, polycrystalline silicon, an oxide semiconductor, and amorphous silicon. For example, the semiconductor layer 120 may include an oxide of a material selected from a metal element such as indium (In), zinc (Zn), gallium (Ga), tin (Sn), germanium (Ge), or a combination thereof. The semiconductor layer 120 may be formed by, for example, forming an amorphous silicon layer on the first substrate 100 by using a deposition method such as PECVD, LPCVD, or the like, crystallizing the amorphous silicon layer, and then patterning the crystallized amorphous silicon layer through an etching process.

The semiconductor layer 120 may be partitioned by being doped with an impurity, and the semiconductor layer 120 may be divided into a channel region where no impurity is doped, a source region where an impurity is doped, and a drain region where an impurity is doped. For example, the source region and the drain region may be formed by ion-injection of one of an N-type impurity and a P-type impurity.

The gate insulation layer 130 may be formed to cover the semiconductor layer 120 and an exposed part of the first substrate 100, and may include, for example, a silicon nitride (SiNx) or a silicon oxide (SiOx).

The gate electrode 140 may be on the gate insulation layer 130, and a film made of, for example, copper (Cu), molybdenum (Mo), aluminum (Al), titanium (Ti), or the like may be provided as multiple layers or a single layer to form it. The gate electrode 140 may have a width or a size that corresponds to that of the channel region of the semiconductor layer 120.

The interlayer insulation layer 150 may be on the gate electrode 140, and may be formed to cover the gate electrode 140 and the gate insulation layer 130. Like the gate insulation layer 130, the interlayer insulation layer 150 may include, for example, a silicon nitride (SiNx) or a silicon oxide (SiOx).

The source electrode 161 and the drain electrode 162 may be formed on the interlayer insulation layer 150, while penetrating the gate insulation layer 130 and the interlayer insulation layer 150, such that the source electrode 161 and the drain electrode 162 are connected with the source region and the drain region of the semiconductor layer 120, while penetrating the gate insulation layer 130 and the interlayer insulation layer 150. The source electrode 161 or the drain electrode 162 may be connected with a data line and thus may apply a data voltage to the thin film transistor.

The gate electrode 140, the source electrode 161, and the drain electrode 162 form a transistor, together with the semiconductor layer 120. The shown transistor may be a driving transistor in a pixel of the OLED display. Since the gate electrode 140 is disposed above the semiconductor layer 120, the illustrated transistor may be referred to as a top-gate transistor. The structure of the transistor may be variously changed. For example, the transistor may be provided as a bottom-gate type of transistor where the gate electrode is disposed below the semiconductor layer, or may be provided as a vertical type of transistor where the source electrode and the drain electrode overlap each other.

The planarization layer 170 may be on the interlayer insulation layer 150 and may cover the source electrode 161 and the drain electrode 162. The planarization layer 170 may be on the interlayer insulation layer 150, and may cover only a side surface of a common voltage transmission line 165. The planarization layer 170 may include a siloxane material (Si—O based structure). In an example embodiment, the siloxane material that forms the planarization layer 170 may include a compound as shown below in Chemical Formula 1.

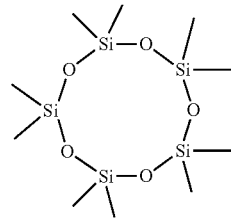

[Chemical Formula 1]

The pixel electrode 190 may be on the planarization layer 170. The pixel electrode 190 may be made of, for example, a transparent conductive material such as indium-tin oxide (ITO), indium-zinc-oxide (IZO), or the like, or a reflective metal such as lithium (Li), calcium Ca), lithium fluoride/aluminum (LiF/Al), aluminum (Al), silver (Ag), magnesium (Mg), or gold (Au). The pixel electrode 190 may be electrically connected with the drain electrode 162 through a contact hole, and may be an anode of the OLED display.

The barrier rib 180 may be on the common voltage transmission line 165 and the pixel electrode 190. The barrier rib 180 may be disposed while overlapping a part of the common voltage transmission line 165 and the entire pixel electrode 190, and may have an opening in a portion that overlaps the pixel electrode 190. The opening of the barrier rib 180 may limit a region corresponding to a pixel.

The barrier rib 180 may include a siloxane material (Si—O based material). In an example embodiment, the siloxane material that forms the barrier rib 180 may include a compound as shown below in Chemical Formula 1.

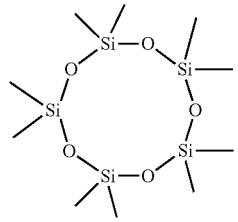

[Chemical Formula 1]

An organic emission layer 191 may be on the pixel electrode 190. The organic emission layer 191 may be formed between every exposed barrier rib 180 such that the organic emission layer 191 and the pixel electrode 190 can be overlapped with each other.

The organic emission layer 191 may be provided as a multilayer that includes at least one of an emission layer, a hole injection layer (HIL), a hole transport layer (HTL), an electron transport layer (ETL), and an electron-injection layer (EIL). The organic emission layer 191 may include, for example, a red organic emission layer, a green organic emission layer, and a blue organic emission layer, and they may be respectively provided in a red pixel, a green pixel, and a blue pixel to realize a colored image.

The common electrode 192 may be formed to cover the organic emission layer 191 and a part of the barrier rib 180. The common electrode 192 may be formed of, for example, a transparent conductive material such as indium-tin oxide (ITO), zinc oxide (ZnO), indium oxide ($In_2O_3$), or the like. In an example embodiment, the common electrode 192 may be formed of, for example, a reflective metal such as lithium (Li), calcium (Ca), lithium fluoride/aluminum (LiF/Ca), magnesium (Mg), or gold (Au). The common electrode 192 may be a cathode of the OLED display. The pixel electrode 190, the organic emission layer 191, and the common electrode 192 form an organic light emitting diode OLED.

The common electrode 192 may be connected to a connection member 195 through a contact hole formed in the barrier rib 180. The connection member 195 may be connected to the common voltage transmission line 165, and the common electrode 192 may be electrically connected to the common voltage transmission line 165 through the connection member 195 and receives a common voltage from the common voltage transmission line 165.

The sealing member 300 is disposed between the first substrate 100 and the second substrate 200, and is formed in the non-display area NDA.

Like the planarization layer 170 or the barrier rib 180, the sealing member 300 may include a siloxane material, and like the planarization layer 170 or the barrier rib 180, the sealing member 300 may include the same example embodiment as shown in the following chemical formula.

[Chemical Formula 1]

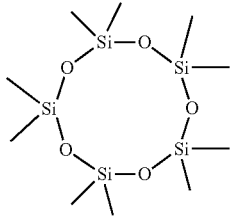

The sealing member 300 includes a first sealing member 301 and a second sealing member 302. Since the sealing member 300 may include the siloxane material like the planarization layer 170 or the barrier rib 180, the first sealing member 301 may be simultaneously formed as the planarization layer 170 is formed, and the second sealing member 302 may be simultaneously formed as the barrier rib 180 is formed.

In addition, the sealing member 300 may be formed of a single structure, and in this case, the sealing member 300 may be simultaneously formed as the planarization layer 170 is formed, or may be simultaneously formed as the barrier rib 180 is formed.

The sealing member 300 is irradiated with a laser and then cured, and accordingly, the first substrate 100 and the second substrate 200 are bonded to each other. Here, a femtosecond laser having a pulse width of within 10-15 seconds may be used.

According to example embodiments, the OLED display uses a siloxane material as the sealing member 300, and carries out irradiation by using the femtosecond laser such that interface adherence between the first substrate 100 and the second substrate 200 can be improved and reliability of excluding moisture and oxygen can be improved.

Hereinafter, referring to FIG. 3 to FIG. 11, a method for manufacturing an OLED display where a display element 50 and a sealing member 300 are formed will be described in detail.

FIG. 3 to FIG. 6 are provided for description of a method for manufacturing an OLED display according to an example embodiment.

Figure 4:
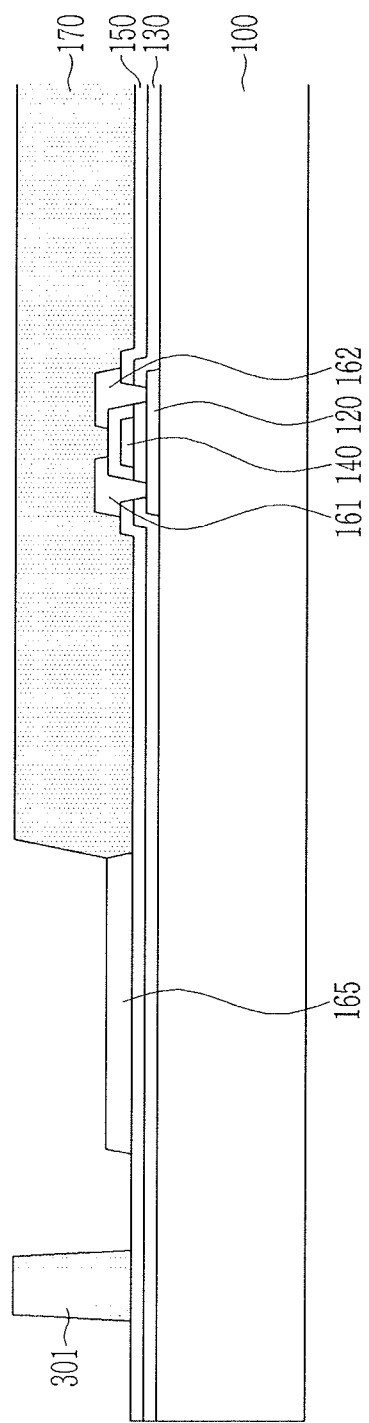

Referring to FIG. 4, a first substrate 100 is disposed at a lower portion, and a patterned semiconductor layer 120 is formed on the first substrate 100. The first substrate 100 may be formed of a rigid material such as glass, quartz, or the like.

The semiconductor layer 120 may be formed by forming an amorphous silicon layer on the first substrate 100 by using a deposition method such as PEVCD, LPCVD, or the like, crystallizing the amorphous silicon layer by using excimer laser annealing (ELA), sequential lateral solidification (SLS), metal induced crystallization (MIC), metal induced lateral crystallization (MILC), or the like, and then patterning the crystallized amorphous silicon layer through an etching process.

The semiconductor layer 120 includes a source region and a drain region, and a channel region that is disposed between the source region and the drain region. The source region and the drain region are formed by ion-injecting one of impurities having predetermined conductivity, for example, an N-type impurity or a P-type impurity, and the channel region may not be doped with an impurity.

A gate insulation layer 130 is formed to cover the semiconductor layer 120 and an exposed portion of the first substrate 100. The gate insulation layer 130 may be made of a silicon nitride (SiNx) or a silicon oxide (SiOx), or may have a layered structure thereof.

A gate electrode 140 is on the gate insulation layer 130 to correspond to the channel region. An interlayer insulation layer 150 is formed on the first substrate 100 to cover the gate electrode 140. The interlayer insulation layer 150 may be made of a silicon nitride (SiNx) or a silicon oxide (SiOx), or may have a layered structure thereof.

A source electrode 161 and a drain electrode 162 are respectively formed while penetrating a contact hole of the gate insulation layer 130 and a contact hole of the interlayer insulation layer 150 so as to be electrically connected with the source region and the drain region of the semiconductor layer 120.

Referring to FIG. 4, a planarization layer 170 is formed to cover the source electrode 161, the drain electrode 162, and a data line. The planarization layer 170 may include a siloxane material (Si—O based structure).

When the planarization layer 170 is formed by using the siloxane material, a sealing member 300 may be simultaneously formed at one side of the non-display area NDA. Like the planarization layer 170, the sealing member 300 may be formed through one mask patterning process by using a siloxane material.

The sealing member 300 may have a similar height as a top surface of the planarization layer 170, which is formed flat.

As described, in the method for manufacturing the OLED display, the sealing member 300 is simultaneously formed when the planarization layer 170 including the siloxane material is patterned, thereby reducing the process of applying a separate sealing member.

Figure 5:
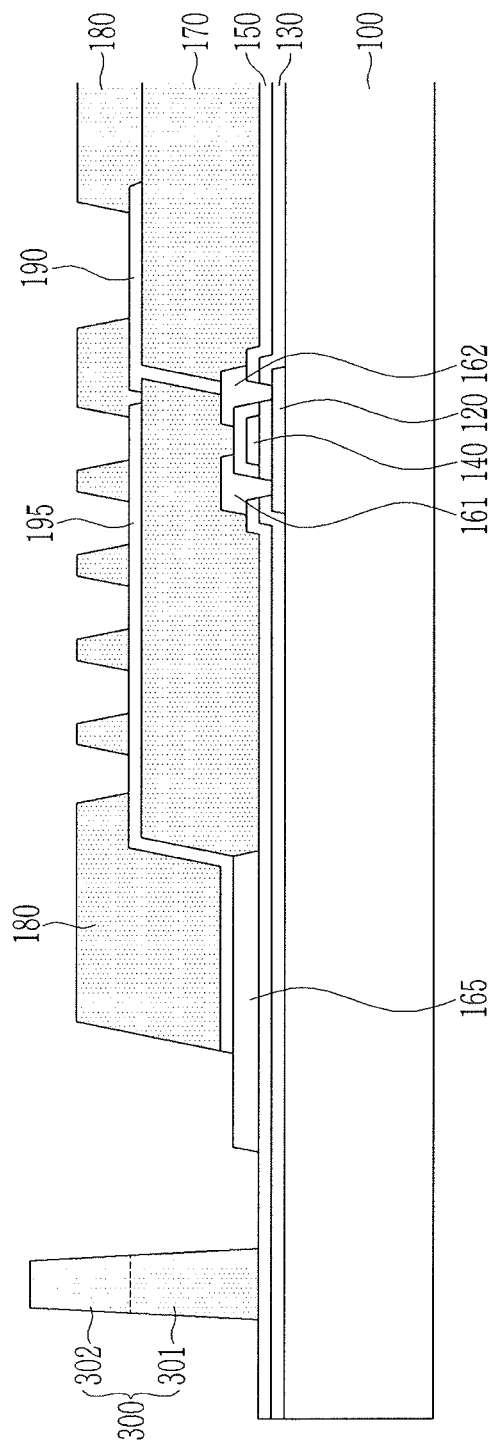

Referring to FIG. 5, a pixel electrode 190 is formed on the planarization layer 170. The pixel electrode 190 may be formed in a shape that covers a side surface and the top surface of the planarization layer 170. The pixel electrode 190 may be made of a transparent conductive material or a reflective metal. The pixel electrode 190 may have an opening so as to be electrically connected with the drain electrode 162 through a contact hole.

A barrier rib 180 includes an opening that exposes the pixel electrode 190, and is formed on the pixel electrode 190.

The barrier rib 180 may be made of a siloxane material. Simultaneously, the sealing member 300 including the siloxane material may be formed at one side of the non-display area NDA when the barrier rib 180 is patterned. In this case, the sealing member 300 may be formed by extending to the sealing member 300 already formed and to have a height that is similar to the height of the top surface of the barrier rib 180. In another example embodiment, the sealing member 300 may be formed to be higher than the top surface of the barrier rib 180 by as much as a distance between the first substrate 100 and the second substrate 200. Since the first substrate 100 and the second substrate 200 have a gap of about 5 μm, the sealing member 300 may have a height of about 5 μm.

Figure 6:
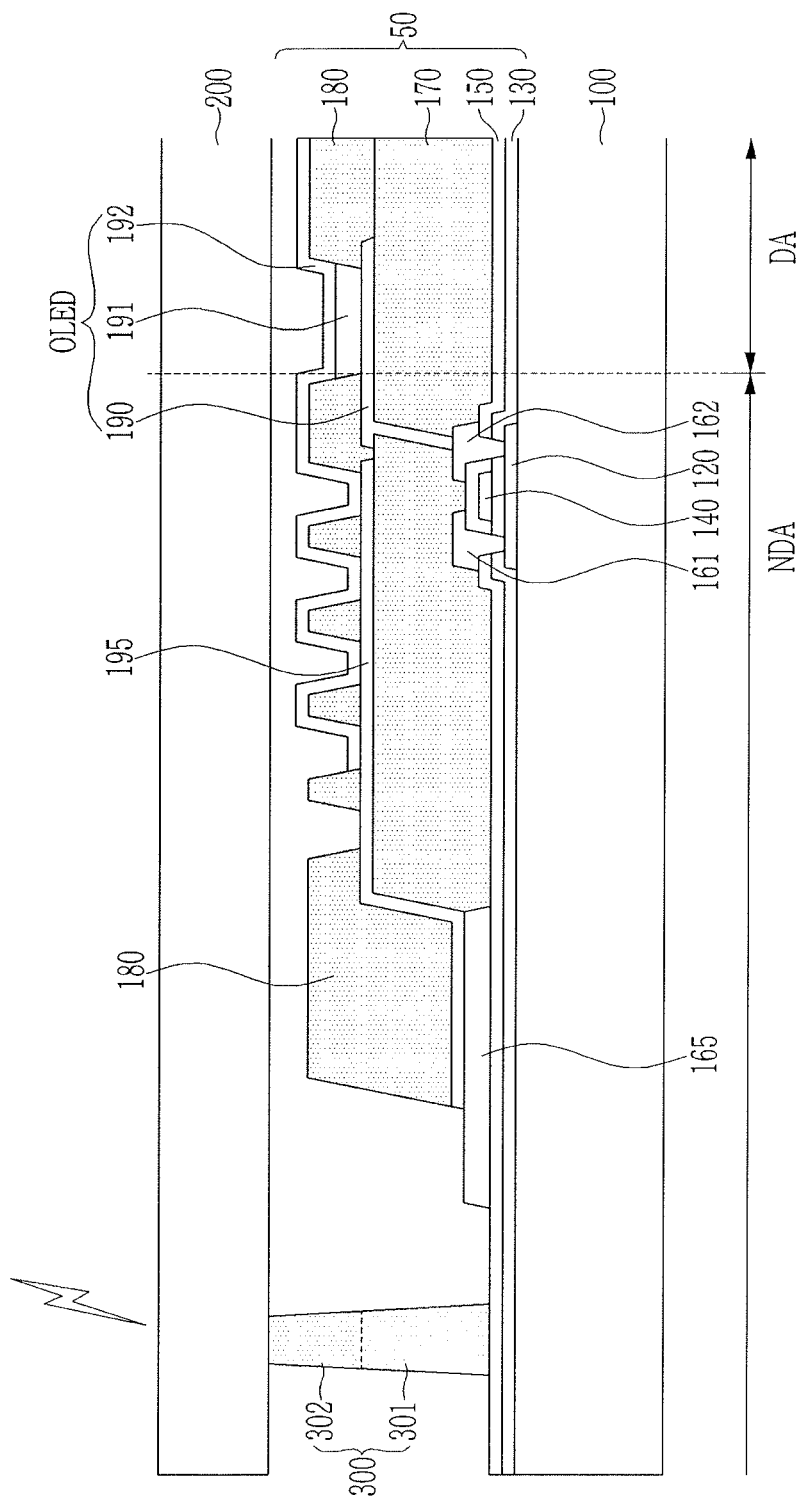

Referring to FIG. 6, an organic emission layer 191 is formed in the opening of the barrier rib 180, and a common electrode 192 may be formed on a part of the barrier rib 180 and the organic emission layer 191 to cover the same.

The second substrate 200 is positioned to face the first substrate 100, and the first substrate 100 and the second substrate 200 can be bonded by irradiating a femtosecond laser at the position where the sealing member 300 is formed.

The femtosecond laser can transmit all infrared (IR) wavelengths when a laser is irradiated to a material made of glass. Therefore, due to the nonlinear multiphoton absorption phenomenon, high energy is concentrated in a focus area irradiated with the laser, and thus a double material can be bonded.

The femtosecond laser matches a focus area at a spot where the sealing member 300 and the first substrate 100 or the second substrate 200 contact each other, and bonds the two substrates 100 and 200 by melting the sealing member 300 within a short period of time. When the femtosecond laser is irradiated, the sealing member 300 may have a width of 10 μm and a height of 20 μm to bond the two substrates. This is a value that enables both substrates to be bonded even when only a thinner sealing member is applied than when a frit is used according to a comparative example.

According to example embodiments; the siloxane material is thinly coated as the sealing member 300 and the femtosecond laser is used, and thus an area occupied by the sealing member 300 in the substrate is reduced and a dead space of the non-display area NDA can be reduced.

According to an example embodiment, in the method for manufacturing the OLED display, the sealing member 300 is simultaneously formed when the planarization layer 170 or the barrier rib 180 including the siloxane material is patterned, thereby reducing the process of applying a separate sealing member Hereinafter, another method for manufacturing an OLED display where a display element 50 and a sealing member 300 are formed will be described.

FIG. 7 to FIG. 10 are provided for description of another manufacturing method of an OLED display according to an example embodiment.

Figure 3:
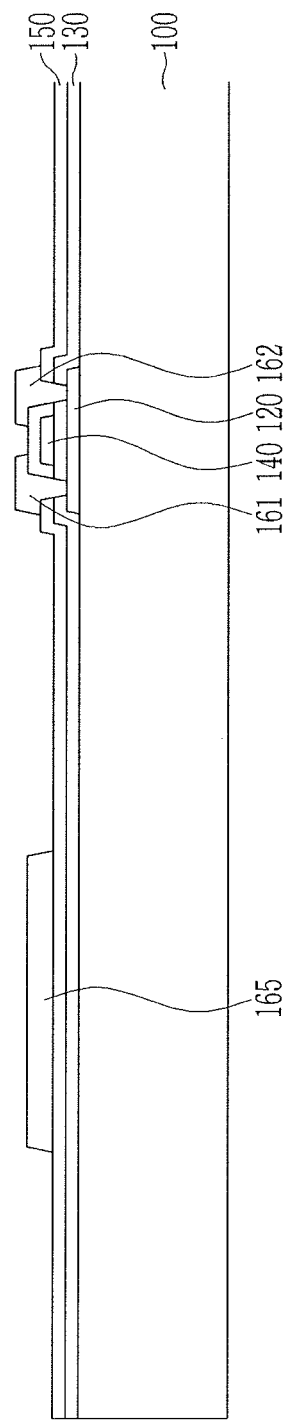
FIG. 3 to FIG. 6 illustrate stages in a manufacturing method of an organic light emitting diode display device according to an example embodiment.
Figure 7:
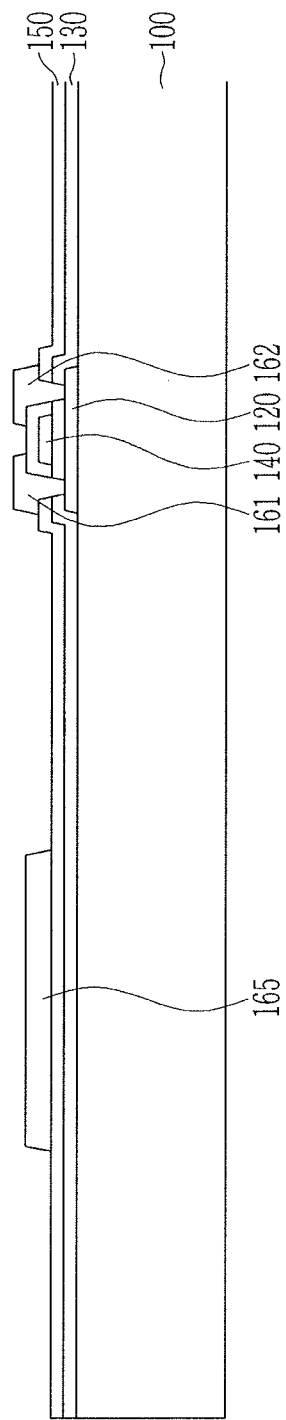
FIG. 7 to FIG. 10 illustrate stages in a manufacturing method of an organic light emitting diode display device according to another example embodiment.

The manufacturing method of the OLED display that includes a first substrate 100, a semiconductor layer 120, a gate electrode 140, a source electrode 161, a drain electrode 162, a gate insulation layer 130, and an interlayer insulation layer 150 shown in FIG. 7 is the same as the OLED display of FIG. 3, and therefore the same description will be omitted.

Figure 8:
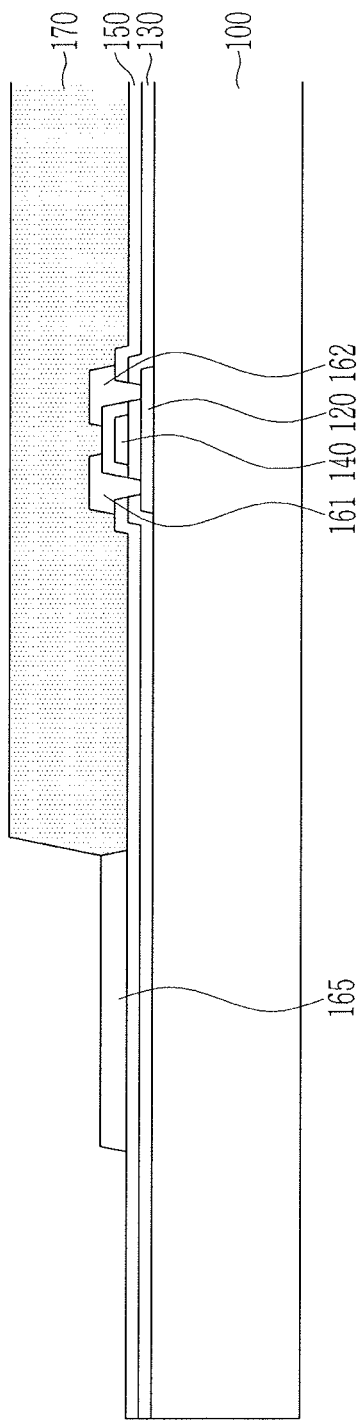

Referring to FIG. 8, a planarization layer 170 is formed to cover the source electrode 161 and the drain electrode 162. The planarization layer 170 may be formed of a material selected from a group consisting of benzocyclobutene (BCB), a polyimide (PI), a polyamide (PA), an acryl resin, and a phenol resin, which are generally-used organic materials for a planarization layer.

Figure 9:
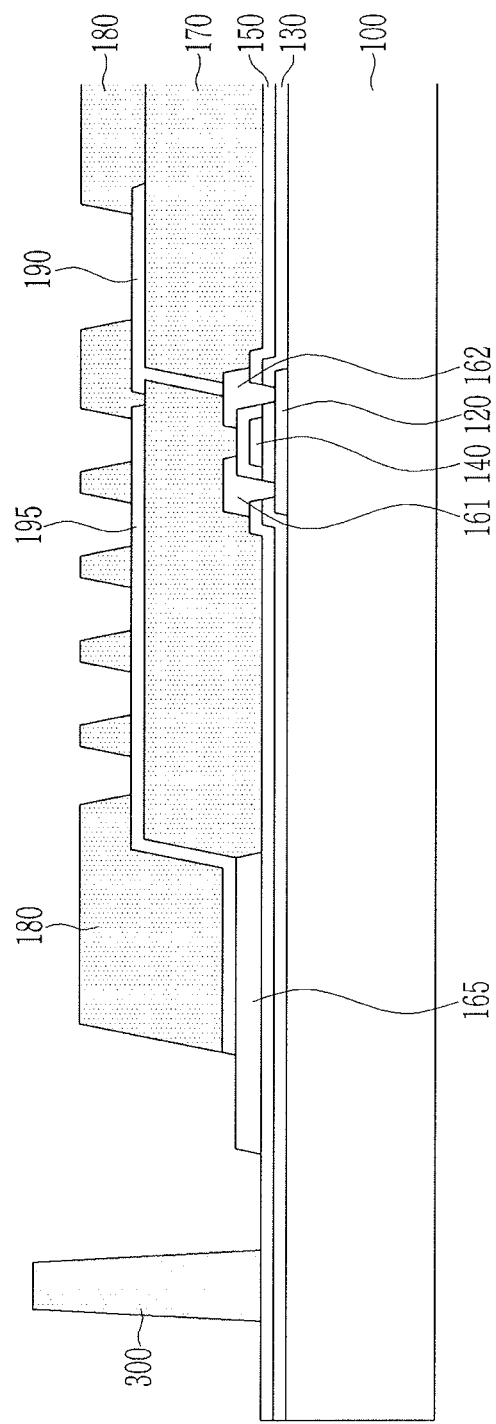

Next, referring to FIG. 9, as in FIG. 5, a pixel electrode 190 is formed on the planarization layer 170.

A barrier rib 180 may be made of a siloxane material so as to be on the pixel electrode 190. The sealing member 300 including the siloxane material may be simultaneously formed at one side of the non-display area NDA when the barrier rib 180 is patterned. The sealing member 300 may have a similar height to that of a top surface of the barrier rib 180. In addition, it may also be formed higher than the top surface of the barrier rib 180 by a distance of between the first substrate 100 and the second substrate 200. Since the first substrate 100 and the second substrate 200 have a gap of about 5 μm, the sealing member 300 may have a height of about 5 μm.

Figure 10:
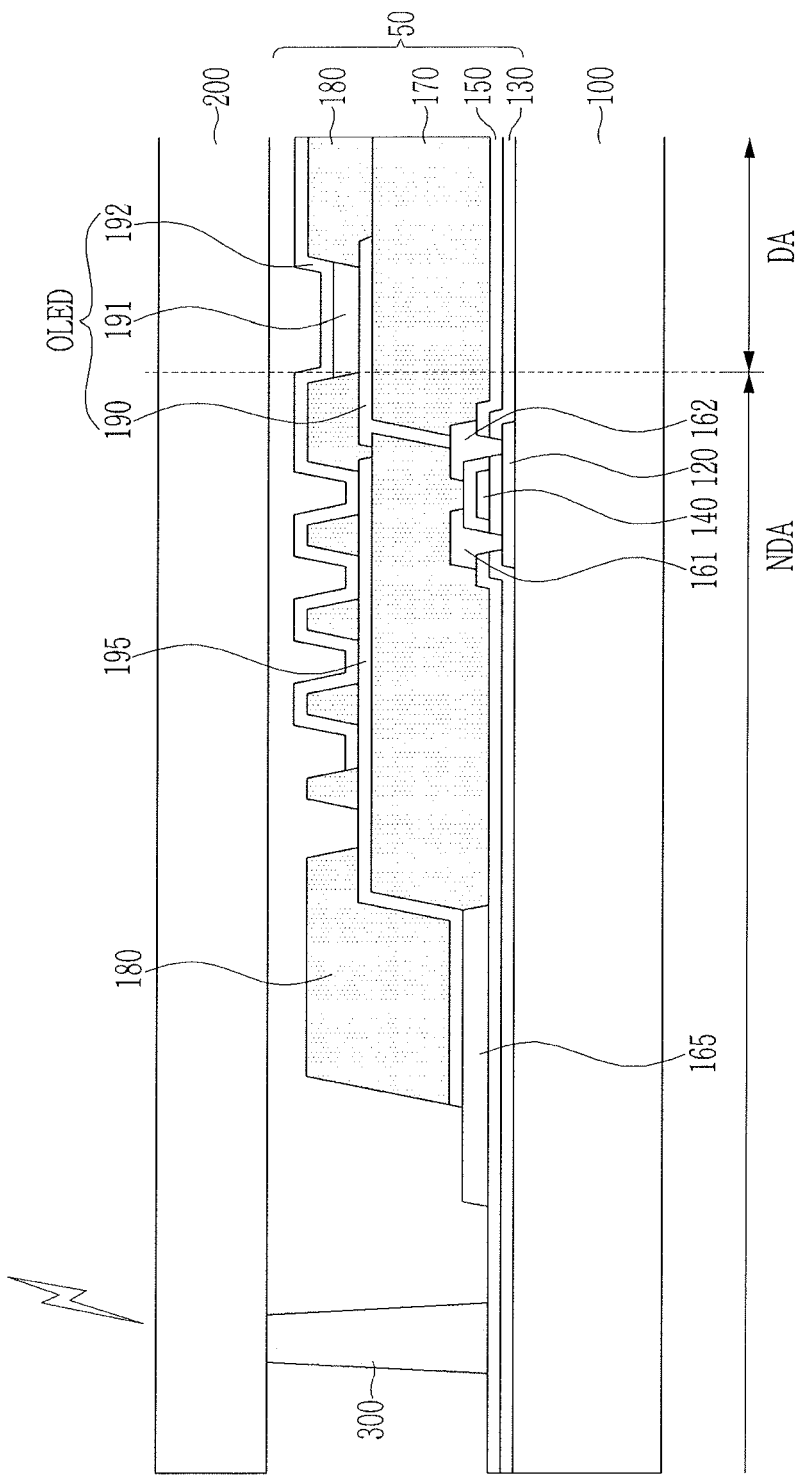

Referring to FIG. 10, an organic emission layer 191 is formed in an opening of the barrier rib 180, and a common electrode 192 may be formed on a part of the barrier rib 180 and an organic emission layer 191 to cover the barrier rib 180 and the organic emission layer 191.

The second substrate 200 is disposed to face the first substrate 100, and a femtosecond laser is irradiated to a position where the sealing member 300 is formed such that the first substrate 100 and the second substrate 200 are bonded to each other.

According to example embodiments, the OLED display uses a siloxane material as the sealing member 300, and the femtosecond laser is irradiated such that interface adherence between the first substrate 100 and the second substrate 200 can be improved and reliability of excluding moisture and oxygen can be improved.

In addition, in the method for manufacturing the OLED display, the sealing member is simultaneously formed when the planarization layer or the barrier rib including the siloxane material is patterned, thereby reducing the process of applying a separate sealing member.

Figure 11:
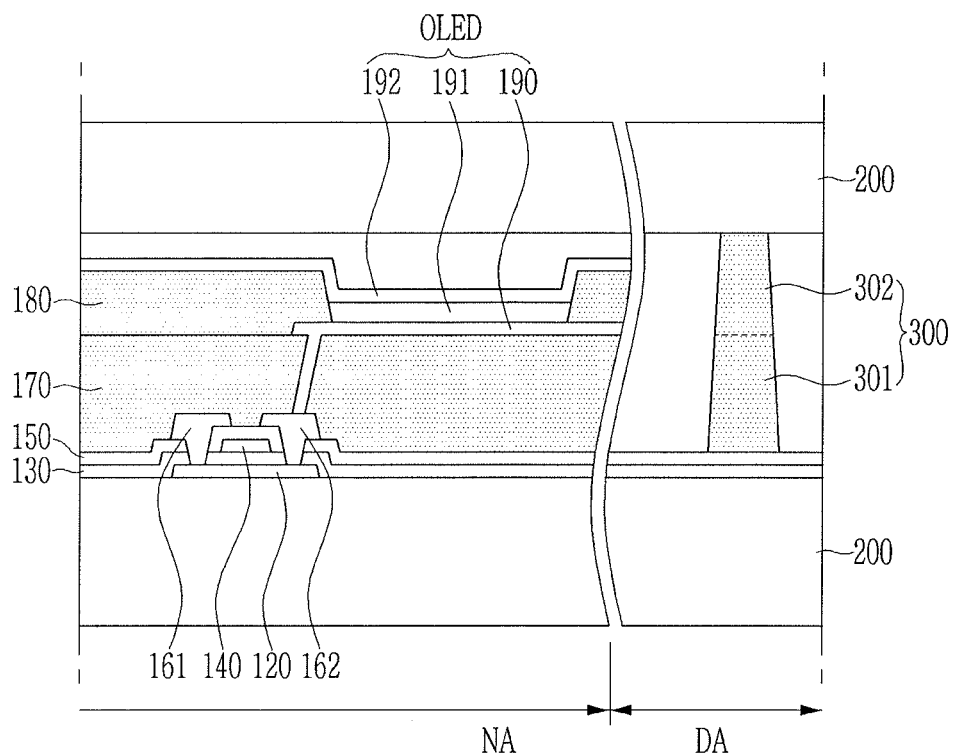
FIG. 11 illustrates a cross-sectional view of an organic light emitting diode display device according to an example embodiment.

FIG. 11 is a cross-sectional view of an OLED display according to an example embodiment.

Specifically, FIG. 11 is provided for description of a structure that includes a sealing member 300 formed at a side surface of a pixel area.

Referring to FIG. 11, an OLED display according to an example embodiment includes a first substrate 100, a second substrate 200, a display element 50, and a sealing member 300. Specifically, the display element 50 includes a semiconductor layer 120, a gate insulation layer 130, a gate electrode 140, an interlayer insulation layer 150, a source electrode 161, a drain electrode 162, a planarization layer 170, a pixel electrode 190, a barrier rib 180, an emission layer 191, and a common electrode 192.

The first substrate 100 and the second substrate 200 may be formed as an insulation substrate that is made of glass, quartz, ceramic, or the like.

The semiconductor layer 120 is on the first substrate 100, and may include polycrystalline silicon, an oxide semiconductor, and amorphous silicon.

The gate insulation layer 130 is formed to cover the semiconductor layer 120 and an exposed first substrate 100, and may include a silicon nitride (SiNx) or a silicon oxide (SiOx).

The gate electrode 140 is on the gate insulation layer 130, and may be a layer made of copper (Cu), molybdenum (Mo), aluminum (Al), titanium (Ti), or the like and formed as a multiple layer or a single layer. The gate electrode 140 may have a width or a size that corresponds to that of a channel region of the semiconductor layer 120.

The interlayer insulation layer 150 is on the gate electrode 140, and covers the gate electrode 140 and the gate insulation layer 130. Like the gate insulation layer 130, the interlayer insulation layer 150 may include a silicon nitride (SiNx) or a silicon oxide (SiOx).

The source electrode 161 and the drain electrode 162 are formed on the interlayer insulation layer 150, while penetrating the gate insulation layer 130 and the interlayer insulation layer 150. The source electrode 161 and the drain electrode 162 are connected with a source region and a drain region of the semiconductor layer 120 by penetrating the gate insulation layer 130 and the interlayer insulation layer 150.

The gate electrode 140, the source electrode 161, and the drain electrode 162 form a transistor, together with the semiconductor layer 120. The illustrated transistor may be a driving transistor in a pixel of the OLED display.

The planarization layer 170 is on the interlayer insulation layer 150, and covers the source electrode 161 and the drain electrode 162. The planarization layer 170 may include a siloxane material (Si—O based structure). Here, a structure of siloxane that forms the planarization layer 170 may include an example embodiment as shown in the following Chemical Formula 1.

[Chemical Formula 1]

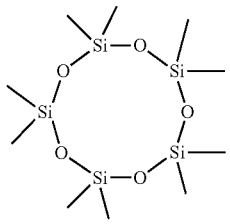

The pixel electrode 190 may be on the planarization layer 170. The pixel electrode 190 may be connected with the drain electrode 162 through a contact hole of the planarization layer 170. The pixel electrode 190 may be made of a transparent conductive material such as indium-tin oxide (ITO), indium-zinc-oxide (IZO), or the like, or a reflective metal such as lithium (Li), calcium (Ca), lithium fluoride/aluminum (LiF/Al), aluminum (Al), silver (Ag), magnesium (Mg), or gold (Au). The pixel electrode 190 is electrically connected with the drain electrode 162 through a contact hole, and thus may become an anode of the OLED display.

The barrier rib 180 may be on the planarization layer 170 and a part of the pixel electrode 190. A structure of siloxane that forms the barrier rib 180 may include an example embodiment as shown in the following Chemical Formula 1.

[Chemical Formula 1]

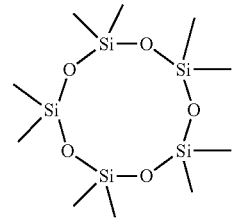

An organic emission layer 191 is on the pixel electrode 190. The organic emission layer 191 may be disposed between barrier ribs 180 that are exposed such that the organic emission layer 191 and the pixel electrode 190 overlap each other.

The organic emission layer 191 may be provided as a multilayer that includes at least one of an emission layer, a hole injection layer (HIL), a hole transport layer (HTL), an electron transport layer (ETL), and an electron-injection layer (EIL). The organic emission layer 191 may include a red organic emission layer, a green organic emission layer, and a blue organic emission layer, and they are respectively provided in a red pixel, a green pixel, and a blue pixel to realize a colored image.

The common electrode 192 may be formed to cover the organic emission layer 191 and a part of the barrier rib 180. The common electrode 192 may be formed of, for example, a transparent conductive material such as indium-tin oxide (ITO), zinc oxide (ZnO), indium oxide (In$_2$O$_3$), or the like. In an example embodiment, the common electrode 192 may be formed of, for example, a reflective metal such as lithium (Li), calcium (Ca), lithium fluoride/aluminum (LiF/Ca), magnesium (Mg), or gold (Au). The common electrode 192 may be a cathode of the OLED display. The pixel electrode 190, the organic emission layer 191, and the common electrode 192 may form an organic light emitting diode OLED.

The sealing member 300 may be disposed between the first substrate 100 and the second substrate 200, and may be formed in the non-display area NDA.

Like the planarization layer 170 or the barrier rib 180, the sealing member 300 may include a siloxane material. In an example embodiment, like the planarization layer 170 or the barrier rib 180, the sealing member 300 may include a siloxane material that includes a compound as shown below in Chemical Formula 1.

[Chemical Formula 1]

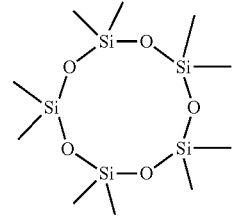

The sealing member 300 may include a first sealing member 301 and a second sealing member 302. The sealing member 300 may include the siloxane material like the planarization layer 170 or the barrier rib 180. Thus, the first sealing member 301 may be simultaneously formed as the planarization layer 170 is formed, and the second sealing member 302 may be simultaneously formed as the barrier rib 180 is formed.

The sealing member 300 may be irradiated by a laser and then cured, and accordingly, the first substrate 100 and the second substrate 200 may be bonded to each other. A femtosecond laser having a pulse width of within $10^{-15}$ seconds may be used for the irradiation.

According to an example embodiment, the OLED display uses a siloxane material as the sealing member 300, and carries out irradiation by using the femtosecond laser. Thus, interface adherence between the first substrate 100 and the second substrate 200 may be improved, and reliability of excluding moisture and oxygen may be improved.

Figure 12:
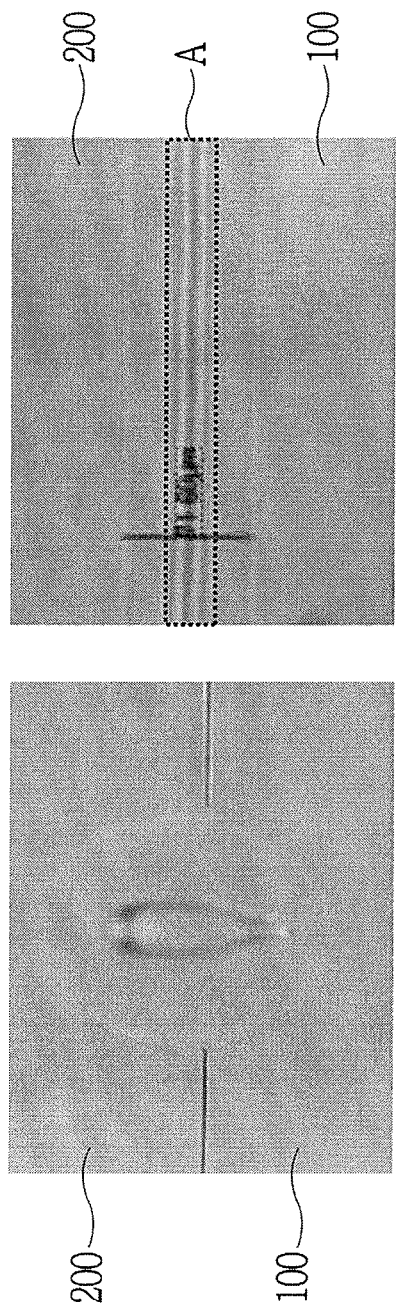
FIG. 12 illustrates images of cross-sections of an OLED display according to an example embodiment.

FIG. 12 shows images of cross-sections of an OLED display according to an example embodiment.

FIG. 12 shows a first substrate 100 and a second substrate 200 bonded to each other by a sealing member 300.

The left-side image is a cross-sectional image of a single sealing member 300 coated on the first substrate 100 or the second substrate 200 and to which a femtosecond laser is irradiated to the coated sealing member 300.

The right-side image is a cross-sectional view of the first substrate 100 and the second substrate 200 that are bonded to each other by coating the sealing member 300 and then irradiating the femtosecond laser to the sealing member 300.

The femtosecond laser can transmit all infrared (IR) wavelengths when a laser is irradiated to a material made of glass. Therefore, due to a nonlinear multiphoton absorption phenomenon, high energy may be concentrated in a focus area irradiated with the laser, and thus a double material may be bonded. When the femtosecond laser is used, the laser may be irradiated for a shorter time than the time it takes to transfer the heat and change the structure, so that the glass and glass or glass and silicon may be melted and bonded without damaging the peripheral area.

In the OLED display according to the present example embodiment, the femtosecond laser is used to bond the first substrate 100 and the second substrate 200 to each other, and thus as shown in the right-side image of FIG. 12, the first substrate 100 and the second substrate 200 may be safely bonded to each other without causing damage to the first substrate 100 and the second substrate 200, except for a denatured region A, which is a bonded portion where the sealing member 300 is applied.

The femtosecond laser may be used to bond substrates made of glass and glass or glass and silicon by melting the same, and thus, referring to FIG. 13, a figure that shows bonding of other substrates will be described.

FIG. 13 is a cross-sectional view of bonding of different types of substrates.

First, four images aligned in the upper side are cross-sectional views that show a state after the sealing member 300 is applied to the upper surface of the second substrate 200 and the lower surface of the first substrate 100 that are respectively made of glass and irradiated with the femtosecond laser.

When the sealing member 300 is applied with a width of about at least 5 μm and a height of about at least 3 μm, the upper and lower substrates may be bonded to each other irrespective of the kind of glass. The width of the sealing member 300 may be, for example, up to 300 μm and the height may be, for example, up to 8 μm.

In addition, the two images arranged in the lower side show a cross-sectional view illustrating a state after coating the sealing member 300 to the upper substrate made of glass and the lower substrate made of silicon and then irradiating the femtosecond laser.

The femtosecond laser irradiates the sealing member 300 that is formed with a width of within 10 μm and a height of within 25 μm in a cross-sectional image, thereby bonding the first substrate 100 and the second substrate 200.

Figure 14:
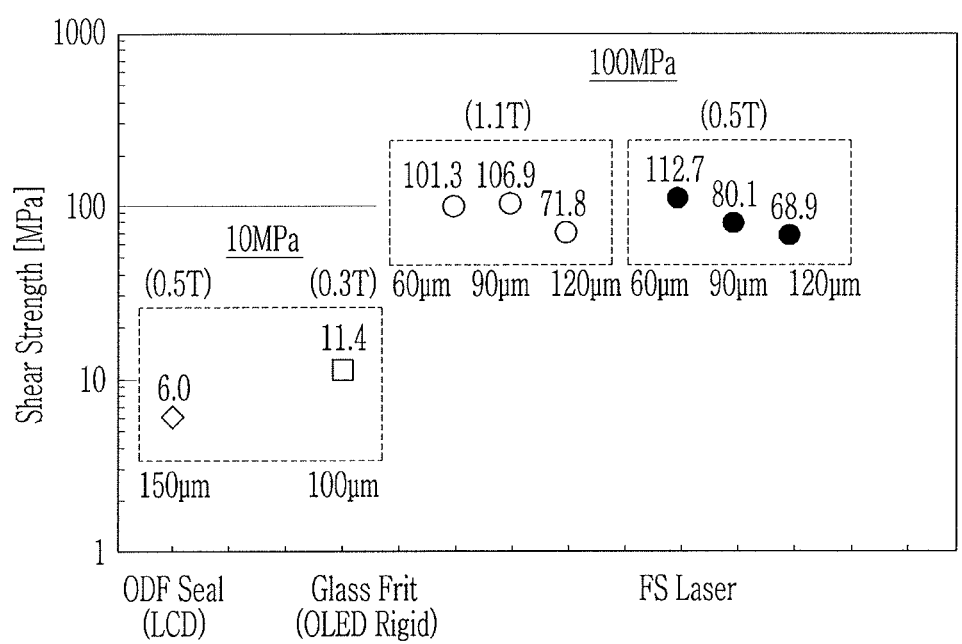
FIG. 14 illustrates a graph showing adherence of the sealing member applied to the OLED display according to an example embodiment.

FIG. 14 is a graph provided for description of adherence of a sealing member 300 applied to an OLED display according to an example embodiment.

In an OLED display (e.g., a rigid OLED) according to a comparative example, a frit is applied as a sealing member to bond upper and lower substrates and a laser is irradiated. Here, in general, the laser has a width of within $10^{-9}$ seconds. In the OLED display device where the frit is used as the sealing member in the comparative example, shear strength of the substrate can be measured within a range of 10 MPa.

Specifically, a case in which the OLED display (i.e., a rigid OLED) according to the comparative example includes a substrate having a thickness of 0.3 T will be described. A sealing member having a width within about 100 μm is applied to the upper and lower substrates and a laser having a width within $10^{-9}$ seconds is irradiated, and then the upper and lower substrates may have shear strength of about 11.4 MPa.

Meanwhile, in the OLED display according to an example embodiment, a siloxane material is applied as the sealing member 300 and the femtosecond laser is irradiated such that the substrates have shear strength within a range of 100 MPa.

Specifically, a case that the OLED display according to an example embodiment includes a substrate having a thickness of 1.1 T or 0.5 T will now be described.

First, in the OLED display including a substrate having a thickness of 1.1 T, the sealing member 300 with a width of 60 μm to 120 μm is applied to the lower substrate, and the femtosecond laser is irradiated thereto to bond the upper substrate and the lower substrate to each other. When the sealing member 300 is applied with a width of 60 μm, the shear strength is 101.3 MPa, when the width is 90 μm, the shear strength is 106.9 MPa, and when the width is 120 μm, the shear strength is 71.8 MPa. Thus, in the OLED display including the substrate having the thickness of 1.1 T, strong interface adherence is generated between the upper and lower substrates when the sealing member 300 with a width of 90 μm is applied.

In the OLED display including a substrate having a thickness of 0.5 T, the sealing member 300 with a width of 60 μm to 120 μm is applied to the lower substrate, and the femtosecond laser is irradiated thereto to bond the upper substrate and the lower substrate to each other. When the sealing member 300 is applied with a width of 60 μm is applied, shear strength is 112.7 MPa, when the width is 90 μm, the shear strength is 80.1 MPa, and when the width is 120 μm, the shear strength is 68.9 MPa. Thus, in the OLED display including the substrate having the thickness of 0.5 T, strong interface adherence is generated between the upper and lower substrates when the sealing member 300 with a width of 60 μm is applied.

A liquid crystal display (LCD) according to another comparative example includes a substrate having a thickness of 0.5 T. In this case, a one drop filling (ODF) sealing member is applied with a width of within 150 μm to bond the upper and lower substrates, but the upper and lower substrates have low shear strength at 6 MPa. The OLED display according to an example embodiment may form upper and lower substrates with 10 times stronger interface adhesion even when a sealing member is coated with a narrower width in a substrate having the same thickness as the LCD according to the comparative example.

As described above, embodiments relate to an OLED display of which an upper substrate and a lower substrate are bonded to each other by a sealing member, and a manufacturing method thereof.

Example embodiments relate to an organic light emitting diode (OLED) display including a sealing member that may improve interface bonding between an upper substrate and a lower substrate and improve reliability of excluding moisture and oxygen, and a method for manufacturing the same.

An OLED display according to an example embodiment may improve the interfacial adhesion between the upper and lower substrates, and may use the siloxane material as the sealing member and the femtosecond laser, and may improve the reliability of excluding moisture and oxygen.

According to an example embodiment, the siloxane material may be thinly applied to the substrate as the sealing member. Thus, an area occupied by the sealing member in the substrate may be reduced and a dead space of the non-display area may be reduced.

According to an example embodiment, in a method for manufacturing the OLED display, the sealing member may be simultaneously formed when the planarization layer or the barrier rib that includes the siloxane material is formed, thereby reducing or avoiding a process for applying an additional sealing member.

DESCRIPTION OF SYMBOLS

50: display element
100: first substrate
120: semiconductor layer
130: gate insulation layer
140: gate electrode
150: interlayer insulation layer
161: source electrode
162: drain electrode
170: planarization layer
180: barrier rib
190: pixel electrode
191: organic emission layer
192: common electrode
200: second substrate
300: sealing member Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode (OLED) display, comprising:
   a first substrate;
   a second substrate facing the first substrate;
   a sealing member interposed between the first substrate and the second substrate, the sealing member including a siloxane material;
   a semiconductor layer on the first substrate;
   a planarization layer on the semiconductor layer; and
   a barrier rib on the planarization layer,
   wherein the planarization layer or the barrier rib also includes the siloxane material, and
   the sealing member includes a first sealing member that is on a same layer as the planarization layer and a second sealing member that is on a same layer as the barrier rib.

2. The OLED display as claimed in claim 1, wherein the first substrate is divided into a display area and a non-display area, and the sealing member is in the non-display area.

3. The OLED display as claimed in claim 1, wherein the first sealing member has a thickness such that a top surface thereof is at about a same height as a top surface of the planarization layer.

4. The OLED display as claimed in claim 1, wherein the second sealing member has a thickness such that a top surface thereof is higher than a top surface of the barrier rib.

5. The OLED display as claimed in claim 1, wherein a width of the sealing member is about 5 μm to about 300 μm, and a thickness of the sealing member is about 3 μm to about 8 μm.

6. The OLED display as claimed in claim 1, wherein the siloxane material included in the sealing member includes a compound represented by Chemical Formula 1:

[Chemical Formula 1]

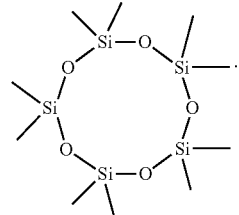

7. The OLED display as claimed in claim 1, wherein the first substrate and the second substrate are bonded to each other by a femtosecond laser.

8. The OLED display as claimed in claim 7, wherein the first substrate and the second substrate are bonded to each other by the femtosecond laser focused at one end of the sealing member.

9. The OLED display as claimed in claim 7, wherein shear strength of the first substrate and the second substrate that are bonded to each other is about 50 MPa to about 200 MPa.

10. The OLED display as claimed in claim 1, further comprising:
    a pixel electrode on the planarization layer;
    an organic emission layer formed on the pixel electrode; and
    a common electrode on the organic emission layer.

11. The OLED display as claimed in claim 1, wherein the first substrate or the second substrate includes glass.

12. A method for manufacturing an organic light emitting diode (OLED) display, the method comprising:

forming a display element on a first substrate;
forming a sealing member that includes a siloxane material on the first substrate; and
bonding the first substrate and a second substrate by placing the second substrate to face the first substrate and irradiating a laser to the sealing member, wherein
the OLED display further comprises:
  a semiconductor layer on the first substrate;
  a planarization layer on the semiconductor layer; and
  a barrier rib on the planarization layer,
the planarization layer or the barrier rib also includes the siloxane material, and
the sealing member includes a first sealing member that is on a same layer as the planarization layer and a second sealing member that is on a same layer as the barrier rib.

13. The method for manufacturing the OLED display as claimed in claim 12, wherein a femtosecond laser is used as the laser.

14. The method for manufacturing the OLED display as claimed in claim 12, wherein the first substrate is divided into a display area where the display element is disposed and a non-display area, and the sealing member is applied to the non-display area to surround the display element.

15. The method for manufacturing the OLED display as claimed in claim 12, wherein the forming the display element on the first substrate includes:

forming a semiconductor layer on the first substrate;
forming a gate insulation layer to cover the semiconductor layer; and
forming a planarization layer on the gate insulation layer.

16. The method for manufacturing the OLED display as claimed in claim 15, wherein the planarization layer includes the siloxane material, and the method further comprises simultaneously forming a first sealing member and the planarization layer.

17. The method for manufacturing the OLED display as claimed in claim 16, further comprising:

forming a barrier rib on the planarization layer, the barrier rib also including the siloxane material; and
simultaneously forming a second sealing member on the first sealing member with the forming of the barrier rib.

18. The method for manufacturing the OLED display as claimed in claim 12, wherein the forming the display element on the first substrate includes:

forming a semiconductor layer on the first substrate;
forming a gate insulation layer to cover the semiconductor layer;
forming a planarization layer on the gate insulation layer; and
forming a barrier rib on the planarization layer.

19. The method for manufacturing the OLED display as claimed in claim 18, wherein the barrier rib also includes the siloxane material, and
the method comprises simultaneously forming the sealing member and the barrier rib.

* * * * *